(12) United States Patent
Li et al.

(10) Patent No.: US 10,199,504 B2
(45) Date of Patent: Feb. 5, 2019

(54) THIN FILM TRANSISTOR AND MANUFACTURING METHOD THEREOF, ARRAY SUBSTRATE, DISPLAY DEVICE

(71) Applicant: BOE TECHNOLOGY GROUP CO., LTD., Beijing (CN)

(72) Inventors: Zhengliang Li, Beijing (CN); Qi Yao, Beijing (CN); Zhanfeng Cao, Beijing (CN); Bin Zhang, Beijing (CN); Xiaolong He, Beijing (CN); Jincheng Gao, Beijing (CN); Xiangchun Kong, Beijing (CN); Wei Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/905,251

(22) PCT Filed: Aug. 5, 2015

(86) PCT No.: PCT/CN2015/086114
§ 371 (c)(1),
(2) Date: Jan. 14, 2016

(87) PCT Pub. No.: WO2016/155178
PCT Pub. Date: Oct. 6, 2016

(65) Prior Publication Data
US 2017/0098714 A1   Apr. 6, 2017

(30) Foreign Application Priority Data
Apr. 3, 2015 (CN) .......................... 2015 1 0159385

(51) Int. Cl.
*H01L 29/10* (2006.01)
*H01L 29/786* (2006.01)
(Continued)

(52) U.S. Cl.
CPC ........ *H01L 29/78606* (2013.01); *H01L 21/28* (2013.01); *H01L 27/1262* (2013.01); *H01L 29/45* (2013.01); *H01L 29/4908* (2013.01)

(58) Field of Classification Search
CPC ................................................ H01L 29/78606
(Continued)

(56) References Cited

U.S. PATENT DOCUMENTS 6,562,668 B2     5/2003  Jang et al.
6,686,661 B1 *   2/2004  Lee ..................... H01L 29/4908
                                                        257/741
(Continued)

FOREIGN PATENT DOCUMENTS

CN           1728403        2/2006
CN       101075640 A       11/2007
(Continued)

OTHER PUBLICATIONS

Office Action in Chinese Application No. 201510159385.0 dated Mar. 13, 2017, with English translation. 14 pages.
(Continued)

*Primary Examiner* — Ajay K Arora
(74) *Attorney, Agent, or Firm* — Womble Bond Dickinson (US) LLP

(57) ABSTRACT

Embodiments of the present invention disclose a thin film transistor and a manufacturing method thereof, an array substrate, and a display device, which relates to the field of display technology, and solves the problem that the adhesion of the electrode thin film with the adjacent thin film layer in the thin film transistor of the prior art is relatively bad. More specifically, an embodiment of the present invention provides a thin film transistor, comprising a gate, a source, a drain and a buffer layer, the buffer layer is located at one side or two sides of the gate, the source or the drain, the material of the buffer layer is a copper alloy material, the copper alloy material contains nitrogen element or oxygen element, the copper alloy material further contains aluminum element.

17 Claims, 1 Drawing Sheet

(51) Int. Cl.
*H01L 21/28* (2006.01)
*H01L 27/12* (2006.01)
*H01L 29/45* (2006.01)
*H01L 29/49* (2006.01)

(58) Field of Classification Search
USPC .......................................................... 257/66
See application file for complete search history.

(56) References Cited

U.S. PATENT DOCUMENTS

| | | | |
|---|---|---|---|
| 8,067,774 B2 | 11/2011 | Choi et al. | |
| 2006/0011917 A1* | 1/2006 | Koo | H01L 27/12 257/66 |
| 2007/0002239 A1 | 1/2007 | Koike | |
| 2008/0278649 A1* | 11/2008 | Koike | H01L 27/12 349/42 |
| 2010/0181563 A1 | 7/2010 | Kim et al. | |

FOREIGN PATENT DOCUMENTS

| | | |
|---|---|---|
| CN | 101179029 A | 5/2008 |
| CN | 103219389 | 7/2013 |
| CN | 103489902 | 1/2014 |
| CN | 103794651 | 5/2014 |
| CN | 103956386 | 7/2014 |
| CN | 104064454 A | 9/2014 |
| CN | 104716202 | 6/2015 |
| JP | 2001176878 A | 6/2001 |

OTHER PUBLICATIONS

International Search Report and Written Opinion with English Language Translation, dated Oct. 28, 2015, Application No. PCT/CN2015/086114.
Office Action in Chinese Application No. 201510159385.0 dated Aug. 16, 2017, with English translation.
Office Action received for Chinese Patent Application No. 201510159385.0, dated Dec. 1, 2017, 12 pages (5 pages of English Translation and 7 pages of Office Action).
International Preliminary Report on Patentability received for PCT Patent Application No. PCT/CN2015/086114, dated Oct. 12, 2017, 13 pages (9 pages of English Translation and 5 pages of Original Document).

\* cited by examiner

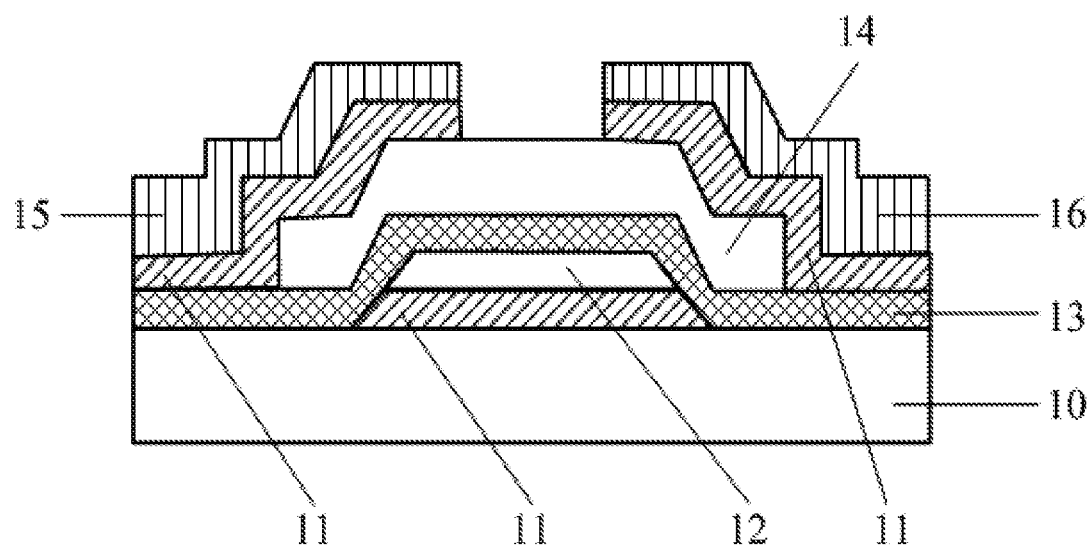

THIN FILM TRANSISTOR AND MANUFACTURING METHOD THEREOF, ARRAY SUBSTRATE, DISPLAY DEVICE

FIELD OF THE INVENTION

The present invention relates to the field of display technology, particularly to a thin film transistor and a manufacturing method thereof, an array substrate, and a display device.

BACKGROUND OF THE INVENTION

The thin film transistor (TFT) is a key component in a liquid crystal display device, and plays very important function to working performance of the display device. The liquid crystal display device for example may comprise a liquid crystal display, and each liquid crystal pixel point on the liquid crystal display is driven by a TFT integrated behind it, so that the liquid crystal display can display screen information at a high speed, high brightness and high contrast.

In recent years, a copper thin film of low resistance has begun to be used on a semiconductor integrated circuit, electrodes and wirings of a thin film transistor. Since the resistance of copper is relatively low, it can increase communication speed of a digital signal and reduce power consumption. However, in the thin film transistor, the adhesion between an electrode thin film and an adjacent thin film layer is relatively bad, particularly the copper electrode thin film. In addition, atoms in the electrode thin film may diffuse into the thin film layer in contact with it, and influence the property of the adjacent thin film layer. For example: the adhesion between a source or drain containing copper and an active layer is relatively bad, and copper atoms in the source or drain containing copper may also diffuse into the active layer and influence the property of the active layer.

To sum up, in the thin film transistor of the prior art, the adhesion between the electrode thin film and the adjacent thin film layer is relatively bad, and the electrode thin film may also influence the property of the adjacent thin film layer.

SUMMARY OF THE INVENTION

Embodiments of the present invention provide a thin film transistor and a manufacturing method thereof, an array substrate, and a display device, which solve the technical problem that adhesion of an electrode thin film with an adjacent thin film layer in a thin film transistor of the prior art is relatively bad.

In order to achieve the above purpose, embodiments of the present invention adopt the following technical solutions:

According to an aspect of the present invention, a thin film transistor is provided, comprising a gate, a source a drain and a buffer layer, the buffer layer is located at one side or two sides of the gate, the source or the drain, the material of the buffer layer is a copper alloy material, the copper alloy material contains nitrogen element or oxygen element, the copper alloy material further contains aluminum element.

Further, the atomic percentage that the aluminum atoms occupy the total atom number of the copper alloy material is 0.05-30%.

Wherein, the copper alloy material further contains a metal element of non-copper and non-aluminum.

Further, the metal element of non-copper and non-aluminum includes at least one element of Ca, Mg, Na, K, Be, Li, Ge, Sr and Ba elements.

Wherein, the atomic percentage that the atoms of the metal element of non-copper and non-aluminum occupy the total atom number of the copper alloy material is 0.05-30%.

Further, the thin film transistor further comprises a base substrate and a gate insulating layer, the base substrate is used for supporting layer structures formed thereon, the gate insulating layer is located on the base substrate, the gate is arranged between the gate insulating layer and the base substrate, the buffer layer is arranged between the gate and the base substrate.

According to another aspect of the present invention, a manufacturing method of a thin film transistor as stated in any of the above solutions is provided, the method comprising: forming a buffer layer at one side or two sides of the gate, the source or the drain.

Further, the buffer layer located at one side or two sides of the source or the drain as well as the source and the drain are formed through one patterning process.

Further, the buffer layer located at one side or two sides of the gate and the gate are formed through one patterning process.

Further, forming the buffer layer comprises: depositing copper and aluminum on the gate, the source or the drain while inletting gas containing nitrogen gas or oxygen gas, a partial pressure generated by the nitrogen gas or the oxygen gas is 1-30% of a total pressure generated by the gas, the rest pressure is a partial pressure of inert gas.

According to a further aspect of the present invention, an array substrate is provided, comprising a thin film transistor as stated in any of the above solutions.

According to yet another aspect of the present invention, a display device is provided, comprising an array substrate as stated in the above solution.

According to embodiments of the present invention, the thin film transistor comprises a buffer layer and the material of the buffer layer is copper alloy material. When the alloy material contains metal copper element and non-metal nitrogen element or oxygen element, a buffer layer as a barrier film with a relatively high adhesion can be manufactured, moreover, when the thin film transistor is manufactured, the manufacturing process of the buffer layer will be easier. When the buffer layer is located at one side or two sides of the gate, the source or the drain, the adhesion between the gate, the source or the drain and the thin film layer connected with it can be improved, meanwhile, atoms in the gate, the source or the drain can also be effectively prevented from diffusing into the film layer connected with it, thereby improving reliability of the thin film transistor. In addition, when the copper alloy material contains aluminum element, the resistance of the alloy material can be reduced effectively, meanwhile, when the thin film transistor is manufactured, the manufacturing process of the buffer layer will be easier, moreover, the manufactured buffer layer is a barrier film with a relatively high adhesion.

BRIEF DESCRIPTION OF THE DRAWING

FIG. 1 is a sectional schematic view of a thin film transistor provided by an embodiment of the present invention.

DETAILED DESCRIPTION OF THE INVENTION

Next, embodiments of the present invention will be described in detail with reference to the drawings.

The terms "first", "second" are only used for the purpose of describing, and cannot be understood as indicating or implying relative importance or implicitly indicating the number of the indicated technical features. Therefore, the features containing the "first", "second" can indicate explicitly or implicitly comprising one or more such features. In the description of the present invention, unless otherwise specified, the meaning of "a plurality of" is two or more.

Referring to FIG. 1, an embodiment of the present invention provides a thin film transistor, comprising a gate, 12, a source 15, a drain 16 and a buffer layer 11, the buffer layer 11 is located at one side or two sides of the gate 12, the source 15 or the drain 16, the material of the buffer layer 11 is a copper alloy material, the copper alloy material contains nitrogen element or oxygen element, the copper alloy material further contains aluminum element.

It needs to be explained that as show in FIG. 1, the structures such as the gate 12, the source 15 and the drain 16 can be arranged on a base substrate 10.

FIG. 1 only shows that the buffer layer is located at one side of the gate 12, the source 15 and the drain 16, i.e., the buffer layer is located at the lower side of the gate 12, the source 15 and the drain 16. Based on needs, the buffer layer can also be located at two sides of the gate 12, the source 15 or the drain 16, i.e., the buffer layer can be located at the upper and lower sides of the gate 12, the source 15 or the drain 16 simultaneously. Due to arrangement of the buffer layer, the adhesion between the gate, the source or the drain and the thin film layer adjacent to it can be improved, meanwhile, the buffer layer can also avoid atoms in the material of the gate, the source or the drain from diffusing into the thin film layer in contact with it, thereby avoiding influence on the property of the adjacent thin film layer.

For example: as shown in FIG. 1, the thin film transistor further comprises an active layer 14, the buffer layer 11 is located at the side of the source 15 close to the active layer 14 (i.e., the buffer layer 11 is located between the source 15 and the active layer 14), thus, the technical problem that the adhesion between the source and the active layer is relatively bad can be solved, and the adhesion between the source 15 and the active layer 14 can be improved. Meanwhile, with the buffer layer arranged between the source 15 and the active layer 14, diffusion of atoms of the source into the active layer can also be avoided. As shown in FIG. 1 again, the buffer layer 11 is located at the side of the drain 16 close to the active layer 14 (i.e., the buffer layer 11 is located between the drain 16 and the active layer 14), thus, the adhesion between the drain 16 and the active layer 14 can be improved, meanwhile, diffusion of atoms of the drain into the active layer can also be avoided.

Generally, the gate, the source or the drain contains copper. The gate, the source or the drain containing copper can increase communication speed of a digital signal and reduce power consumption. In the embodiment of the present invention, due to arrangement of the buffer layer, the technical problem that the adhesion between the gate, the source or the drain and the adjacent thin film layer is relatively bad is solved, the adhesion between the gate, the source or the drain and the adjacent thin film layer is improved; meanwhile, it also avoids the copper atoms in the gate, the source or the drain from diffusing into the adjacent thin film layer (such as the active layer), thereby avoiding the copper atoms in the gate, the source or the drain from influencing the property of the adjacent thin film layer.

The copper alloy material contains nitrogen or oxygen, copper, aluminum. Contents of the nitrogen or oxygen, copper, aluminum can be set based on different requirements, which will not be defined specifically here. For example: the atomic percentage that the aluminum atoms occupy the total atom number of the copper alloy material may be 0.05-30%, the atomic percentage that the nitrogen or oxygen occupies the total atom number of the copper alloy material may also be 0.05-30%, the rest is copper.

In the thin film transistor provided by the embodiment of the present invention, the thin film transistor comprises a buffer layer and the material of the buffer layer is copper alloy material. When the alloy material contains metal copper element and non-metal nitrogen element or oxygen element, a buffer layer as a barrier film with a relatively high adhesion can be manufactured. Moreover, when the thin film transistor is manufactured, the manufacturing process of the buffer layer will be easier. When the buffer layer is located at one side or two sides of the gate, the source or the drain, the adhesion between the gate, the source or the drain and the thin film layer connected with it can be improved, meanwhile, the atoms in the gate, the source or the drain can also be effectively prevented from diffusing into the film layer connected with it, thereby improving reliability of the thin film transistor. In addition, when the copper alloy material contains aluminum element, the resistance of the alloy material can be reduced effectively, meanwhile, when the thin film transistor is manufactured, the manufacturing process of the buffer layer will be easier, moreover, the manufactured buffer layer is a barrier film with a relatively high adhesion.

Further, the atomic percentage that the aluminum atoms occupy the total atom number of the copper alloy material may be 0.05-30%. The buffer layer with the content of the aluminum element in this range has a better adhesion and barrier property.

According to another embodiment, the copper alloy material may further contain a metal element of non-copper and non-aluminum. For example, the metal element of non-copper and non-aluminum may include at least one element of Ca, Mg, Na, K, Be, Li, Ge, Sr and Ba elements. Optionally, the atomic percentage that the atoms of the metal element of non-copper and non-aluminum occupy the total atom number of the copper alloy material is 0.05-30%. In this way, the manufactured buffer layer can have a relatively high adhesion and a relatively high barrier property.

Further, as shown in FIG. 1, the thin film transistor may further comprise a base substrate 10 and a gate insulating layer 13, the base substrate 10 is used for supporting layer structures formed thereon, the gate insulating layer 13 is located on the base substrate 10, the gate 12 is arranged between the gate insulating layer 13 and the base substrate 10, the buffer layer 11 is arranged between the gate 12 and the base substrate 10. The buffer layer can enhance the adhesion between the gate and the base substrate, and increase the contact fastness between the gate and the base substrate, thereby avoiding the gate from lifting off and increasing the life time of the thin film transistor.

An embodiment of the present invention further provides a manufacturing method of the above thin film transistor, the method comprising: forming a buffer layer at one side or two sides of the gate, the source or the drain.

The specific manufacturing method for example can be: placing the copper, aluminum target material in a deposition chamber, depositing a thin film at one side or two sides of the gate, the source or the drain through sputtering or evaporating, and inletting nitrogen gas or oxygen gas at the time of deposition. The method can, based on the added material amount, manufacture a copper alloy material in which the atomic percentage that the aluminum atoms occupy the total atom number of the copper alloy material is 0.05-30%, the atomic percentage that the nitrogen or oxygen occupies the total atom number of the copper alloy material is 0.05-30%, and the rest is copper. In addition, if it needs to add a metal element of non-copper and non-aluminum, the non-copper and non-aluminum metal can be placed in the deposition chamber together with the copper, aluminum, and then a thin film is deposited at one side or two sides of the gate, the source or the drain through sputtering or evaporating, moreover, the nitrogen gas or the oxygen gas is inlet at the time of deposition.

The manufacturing method can also be: manufacturing the nitrogen or oxygen, copper, aluminum into target material according to the preset atomic proportion, then performing deposition at one side or two sides of the gate, the source or the drain so as to form a thin film. In addition, if it needs to add a metal element of non-copper and non-aluminum, the nitrogen or oxygen, the copper, the aluminum and the non-copper and non-aluminum metal can also be manufactured into target material according to the preset atomic proportion, then performing deposition so as to form the thin film.

In the embodiments of the present invention, if a buffer layer is to be formed at one side of the gate, the manufacturing method can be specifically: forming a buffer layer on the base substrate, forming a gate on the buffer layer; and may also be forming a gate on the substrate, and forming a buffer layer on the gate. If the buffer layer is to be formed at tow sides of the gate, the manufacturing method can be specifically: forming a buffer layer on the base substrate, forming a gate on the buffer layer, forming a buffer layer again on the gate. The forming method of the buffer layer for example can adopt the known method in the prior art, which will not be defined specifically here. If the buffer layer is to be formed at one side or two sides of the source or the drain, reference can be made to the manufacturing method of forming a buffer layer at one side or two sides of the gate.

According to the embodiments of the present invention, a buffer layer is formed in the thin film transistor and the material of the buffer layer is a copper alloy material. When the alloy material contains metal copper element and non-metal nitrogen element or oxygen element, a buffer layer as a barrier film with a relatively high adhesion can be manufactured. Moreover, when the thin film transistor is manufactured, the manufacturing process of the buffer layer will be easier. When the buffer layer is located at one side or two sides of the gate, the source or the drain, the adhesion between the gate, the source or the drain and the thin film layer connected with it can be improved, meanwhile, the atoms in the gate, the source or the drain can also be effectively prevented from diffusing into the film layer connected with it, thereby improving reliability of the thin film transistor. In addition, when the copper alloy material contains aluminum element, the resistance of the alloy material can be reduced effectively, meanwhile, when the thin film transistor is manufactured, the manufacturing process of the buffer layer will be easier, moreover, the manufactured buffer layer is a barrier film with a relatively high adhesion.

According to another embodiment of the present invention, the buffer layer located at one side or two sides of the source or the drain as well as the source and the drain are formed through one patterning process. For example, a buffer film layer can be formed at one side or two sides of the source film layer or the drain film layer, and after the buffer film layer, the source film layer and the drain film layer are formed, a buffer layer, a source and a drain are formed through one patterning process respectively, in this way, the number of manufacturing processes of the thin film transistor can be reduced. The same etching solution can be used during the one patterning process.

One patterning process generally means that the number of times of process of performing the patterning through exposing, developing and etching etc. is one.

According to another embodiment of the present invention, the buffer layer located at one side or two sides of the gate and the gate are formed through one patterning process. For example, a buffer film layer can be formed at one side or two sides of the gate film layer, and after the buffer film layer and the gate film layer are formed, a buffer layer and a gate are formed through one patterning process respectively, in this way, the number of manufacturing processes of the thin film transistor can be reduced. The same etching solution can be used during the one patterning process.

Further, forming the buffer layer may comprise: depositing copper and aluminum on the gate, the source or the drain while inletting gas containing nitrogen gas or oxygen gas, a partial pressure generated by the nitrogen gas or the oxygen gas is 1-30% of a total pressure generated by the gas, the rest pressure is a partial pressure of inert gas.

The inert gas is generally argon gas. The pressure generated by the gas can be controlled by the amount of the inlet gas. The partial pressure generated by the nitrogen gas or the oxygen gas can force the alloy elements such as copper, aluminum to form bonding, meanwhile, the nitrogen element or the oxygen element is also added in the formed alloy material.

The embodiment of the present invention further provides an array substrate, the array substrate comprising a thin film transistor as stated in any of the above embodiments. The thin film transistor comprises a buffer layer and the material of the buffer layer is copper alloy material. When the alloy material contains metal copper element and non-metal nitrogen element or oxygen element, a buffer layer as a barrier film with a relatively high adhesion can be manufactured. Moreover, when the thin film transistor is manufactured, the manufacturing process of the buffer layer will be easier. When the buffer layer is located at one side or two sides of the gate, the source or the drain, the adhesion between the gate, the source or the drain and the thin film layer connected with it can be improved, meanwhile, the atoms in the gate, the source or the drain can also be effectively prevented from diffusing into the film layer connected with it, thereby improving reliability of the thin film transistor. In addition, when the copper alloy material contains aluminum element, the resistance of the alloy material can be reduced effectively, meanwhile, when the thin film transistor is manufactured, the manufacturing process of the buffer layer will be easier, moreover, the manufactured buffer layer is a barrier film with a relatively high adhesion. Therefore, the array substrate has a better display performance.

An embodiment of the present invention further provides a display device, the display device comprising the array substrate of the above embodiment. The thin film transistor of the array substrate comprises a buffer layer and the material of the buffer layer is copper alloy material. When the alloy material contains metal copper element and non-metal nitrogen element or oxygen element, a buffer layer as a barrier film with a relatively high adhesion can be manufactured. Moreover, when the thin film transistor is manufactured, the manufacturing process of the buffer layer will be easier. When the buffer layer is located at one side or two sides of the gate, the source or the drain, the adhesion between the gate, the source or the drain and the thin film layer connected with it can be improved, meanwhile, the atoms in the gate, the source or the drain can also be effectively prevented from diffusing into the film layer connected with it, thereby improving reliability of the thin film transistor. In addition, when the copper alloy material contains aluminum element, the resistance of the alloy material can be reduced effectively, meanwhile, when the thin film transistor is manufactured, the manufacturing process of the buffer layer will be easier, moreover, the manufactured buffer layer is a barrier film with a relatively high adhesion. Therefore, the display device has a better display performance.

In the present description, the specific features, structures, materials or characteristics can be combined in an appropriate manner in any one or more embodiments or examples.

What are stated above are only specific embodiments of the present invention, however, the protection scope of the present invention is not limited to this. Any variations or replacements that can be easily conceived by the skilled person familiar with the present technical field should be encompassed within the protection scope of the present invention. Therefore, the protection scope of the present invention shall be subject to the protection scopes of claims attached.

The invention claimed is:

1. A thin film transistor, comprising a gate, a source, and a drain,
wherein the thin film transistor further comprises a buffer layer, the buffer layer is located at one side or two sides of the gate and in direct contact with the gate, the material of the buffer layer is a copper alloy material, the copper alloy material contains nitrogen element or oxygen element, the copper alloy material further contains aluminum element.

2. The thin film transistor according to claim 1, wherein the atomic percentage that the aluminum atoms occupy the total atom number of the copper alloy material is 0.05-30%.

3. The thin film transistor according to claim 1, wherein the copper alloy material further contains a metal element of non-copper and non-aluminum.

4. The thin film transistor according to claim 3, wherein the metal element of non-copper and non-aluminum includes at least one element of Ca, Mg, Na, K, Be, Li, Ge, Sr and Ba elements.

5. The thin film transistor according to claim 3, wherein the atomic percentage that the atoms of the metal element of non-copper and non-aluminum occupy the total atom number of the copper alloy material is 0.05-30%.

6. The thin film transistor according to claim 1, further comprising a base substrate and a gate insulating layer, wherein the base substrate is used for supporting layer structures formed thereon, the gate insulating layer is located on the base substrate, the gate is arranged between the gate insulating layer and the base substrate, the buffer layer is arranged between the gate and the base substrate.

7. A manufacturing method of a thin film transistor according to claim 1, comprising: forming a buffer layer on one surface or two surfaces of the gate; the material of the buffer layer is a copper alloy material, the copper alloy material contains nitrogen element or oxygen element, the copper alloy material further contains aluminum element.

8. The manufacturing method of the thin film transistor according to claim 7, wherein a further buffer layer located at one side or two sides of the source or the drain as well as the source and the drain are formed through a one patterning process; the material of the further buffer layer is same to that of the buffer layer at one side or two sides of the gate.

9. The manufacturing method of the thin film transistor according to claim 7, wherein the buffer layer located at one side or two sides of the gate and the gate are formed through a one patterning process.

10. The manufacturing method of the thin film transistor according to claim 7, wherein forming the buffer layer comprises: depositing copper and aluminum on the gate, the source or the drain while inletting gas containing nitrogen gas or oxygen gas, a partial pressure generated by the nitrogen gas or the oxygen gas is 1-30% of a total pressure generated by the gas, the rest pressure is a partial pressure of inert gas.

11. An array substrate, comprising the thin film transistor according to claim 1.

12. A display device, comprising the array substrate according to claim 11.

13. The array substrate according to claim 11, wherein the atomic percentage that the aluminum atoms occupy the total atom number of the copper alloy material is 0.05-30%.

14. The array substrate according to claim 11, wherein the copper alloy material further contains a metal element of non-copper and non-aluminum.

15. The array substrate according to claim 14, wherein the metal element of non-copper and non-aluminum includes at least one element of Ca, Mg, Na, K, Be, Li, Ge, Sr and Ba elements.

16. The array substrate according to claim 14, wherein the atomic percentage that the atoms of the metal element of non-copper and non-aluminum occupy the total atom number of the copper alloy material is 0.05-30%.

17. The array substrate according to claim 11, further comprising a base substrate and a gate insulating layer, wherein the base substrate is used for supporting layer structures formed thereon, the gate insulating layer is located on the base substrate, the gate is arranged between the gate insulating layer and the base substrate, the buffer layer is arranged between the gate and the base substrate.

* * * * *